(12) United States Patent
Wen

(10) Patent No.: US 11,955,989 B2
(45) Date of Patent: Apr. 9, 2024

(54) MEMORY DEVICE AND TEST METHOD THEREOF

(71) Applicant: NANYA TECHNOLOGY CORPORATION, New Taipei (TW)

(72) Inventor: Chih-Yuan Wen, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/892,105

(22) Filed: Aug. 21, 2022

(65) Prior Publication Data
US 2024/0063823 A1    Feb. 22, 2024

(51) Int. Cl.
*H03M 13/00*  (2006.01)
*H03M 13/11*  (2006.01)

(52) U.S. Cl.
CPC ...... *H03M 13/1148* (2013.01); *H03M 13/611* (2013.01)

(58) Field of Classification Search
CPC ............ H03M 13/611; H03M 13/095; H03M 13/1171; H03M 13/1111; H03M 13/1148
See application file for complete search history.

(56) References Cited

U.S. PATENT DOCUMENTS

| | | | |
|---|---|---|---|
| 4,740,968 A | 4/1988 | Aichelmann, Jr. | |
| 5,291,498 A | 3/1994 | Jackson et al. | |
| 6,295,617 B1 * | 9/2001 | Sonobe | G06F 11/1008 714/E11.036 |
| 6,957,378 B2 * | 10/2005 | Koga | G06F 11/1032 714/763 |
| 7,032,142 B2 * | 4/2006 | Fujioka | G11C 29/42 365/201 |
| 7,996,734 B2 * | 8/2011 | Earle | G06F 11/1048 714/799 |
| 8,122,320 B2 * | 2/2012 | Fekih-Romdhane | G06F 11/1008 714/763 |
| 8,201,033 B2 | 6/2012 | Earle et al. | |
| 10,389,379 B2 * | 8/2019 | Gulati | H03M 13/6566 |
| 11,204,826 B2 * | 12/2021 | Noguchi | G06F 11/1012 |
| 2003/0217321 A1 | 11/2003 | Hsu et al. | |
| 2006/0265636 A1 | 11/2006 | Hummler | |
| 2020/0394102 A1 | 12/2020 | Cha et al. | |
| 2022/0229724 A1 | 7/2022 | Bains et al. | |

FOREIGN PATENT DOCUMENTS

| | | |
|---|---|---|
| TW | 200639869 | 11/2006 |
| TW | 201423756 | 6/2014 |

OTHER PUBLICATIONS

"Office Action of Taiwan Counterpart Application", dated Nov. 29, 2023, p. 1-p. 6.
"Office Action of Taiwan Counterpart Application", dated Sep. 13, 2023, p. 1-p. 6.

\* cited by examiner

*Primary Examiner* — Esaw T Abraham
(74) *Attorney, Agent, or Firm* — JCIPRNET

(57) ABSTRACT

A memory device includes a data array, a parity array and an ECC circuit. The ECC circuit is coupled to the data array and the parity array. In a first test mode, the ECC function of the ECC circuit is disabled, and in a second test mode, the ECC circuit directly accesses the parity array to read or write parity information through the parity array.

16 Claims, 8 Drawing Sheets

MEMORY DEVICE AND TEST METHOD THEREOF

BACKGROUND OF THE INVENTION

Technical Field

The present invention generally relates to a memory device and a test method thereof, and more particularly to the test method for testing the memory device with on-die error checking and correction (ECC) circuitry.

Description of Related Art

An ECC (error checking and correction) function is widely using at modern memory products such as DRAM (dynamic random access memory) and flash memory. The ECC function provides an effective way to eliminate single-bit errors which can decrease reliability and yield. LPDDR4x (Low Power Double Data Rate Synchronous Dynamic Random Access Memory) and DDR5 (Double Data Rate Synchronous Dynamic Random Access Memory) are also included the on-die ECC function. However, the ECC function is provided by several different circuit blocks and combined to normal operations. It will be a great risk of yield and manufacturing cost without effective test way for ECC function. Regarding to this, the ECC function test methodology is proposed, it can be using for the ECC function test including LPDDR4x and DDR5 DRAM.

SUMMARY OF THE INVENTION

The present invention provides a memory device and a test method thereof which can well test an error checking and correction (ECC) function of the memory device.

The memory device includes a data array, a parity array and an ECC circuit. The ECC circuit is coupled to the data array and the parity array. In a first test mode, the ECC function of the ECC circuit is disabled, and in a second test mode, the ECC circuit directly accesses the parity array to read or write parity information through the parity array.

The test method of a memory device includes: providing an error checking and correction (ECC) circuit to couple to a data array and a parity array of the memory device; in a first test mode, disabling an ECC function of the ECC circuit; and in a second test mode, directly accessing the parity array to read or write parity information through the parity array.

In summary, the present disclosure provides the memory device for testing the ECC function by using at least one of the first test mode and the second test mode. Such as that, a plurality of components of the ECC circuit and the memory devices can be well tested, and the ECC function can be confirmed accordingly.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
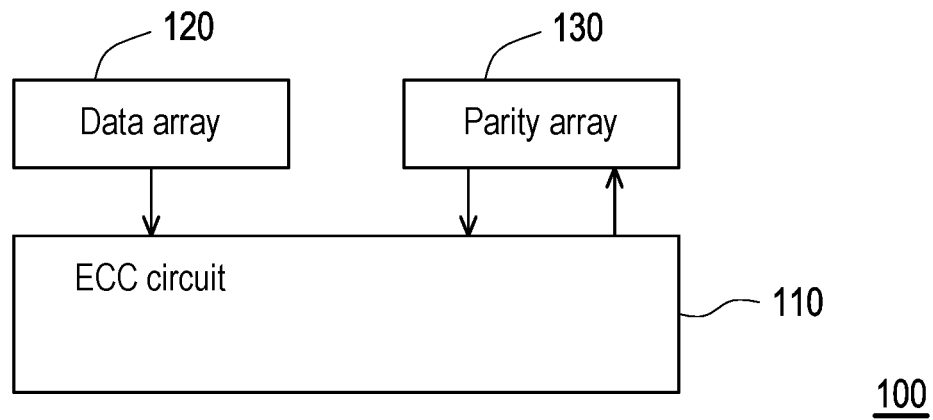
FIG. 1 illustrates a schematic diagram of a memory device according to an embodiment of present disclosure.

Reference will now be made in detail to the present preferred embodiment of the invention, examples of which are illustrated in the accompanying drawings. Wherever possible, the same reference numbers are used in the drawings and the description to refer to the same or like parts.

Please refer to FIG. 1, which illustrates a schematic diagram of a memory device according to an embodiment of present disclosure. The memory device 100 includes an error checking and correcting (ECC) circuit 110, a data array 120 and a parity array 130. The data array 120 includes a plurality of memory cells, and the plurality of memory cells of the data array 120 are configured to store normal data. The parity array 130 may also include a plurality of memory cells, and the plurality of memory cells of the parity array 130 are configured to store parity information corresponding to the normal data.

The ECC circuit 110 is coupled to the data array 120 and the parity array 130. The ECC circuit 110 is configured to perform an ECC function on the normal data of the data array 120 to correct error bit of the normal data in a normal operation mode. In a first test mode of the memory device 100, the ECC function of the ECC circuit 110 may be disabled, and in a second test mode, the ECC circuit 110 may be enabled directly accesses the parity array 130 to read or write parity information through the parity array 130.

In the first test mode, the ECC function of the ECC circuit 110 is disabled, and a native data of the normal can be readout without error bit correction. Such as that, the data array cam be tested. On the other way, in the second test mode, the parity array 130 can be directly accessed, and the parity array 130 and circuit components of the ECC circuit 110 related to the parity array 130 can be tested. Furthermore, a third test mode can be provided. In the third test mode, the ECC circuit can generate parity information corresponding to the normal data, and the normal data and the corresponding parity information can be respectively written into the data array 220 and the parity array 230. Moreover, by mixing the first test mode, the second test mode and the third test mode, almost all of the circuit components of the ECC circuit 110 can be tested to confirm the ECC function can be correctly executed.

Figure 2:
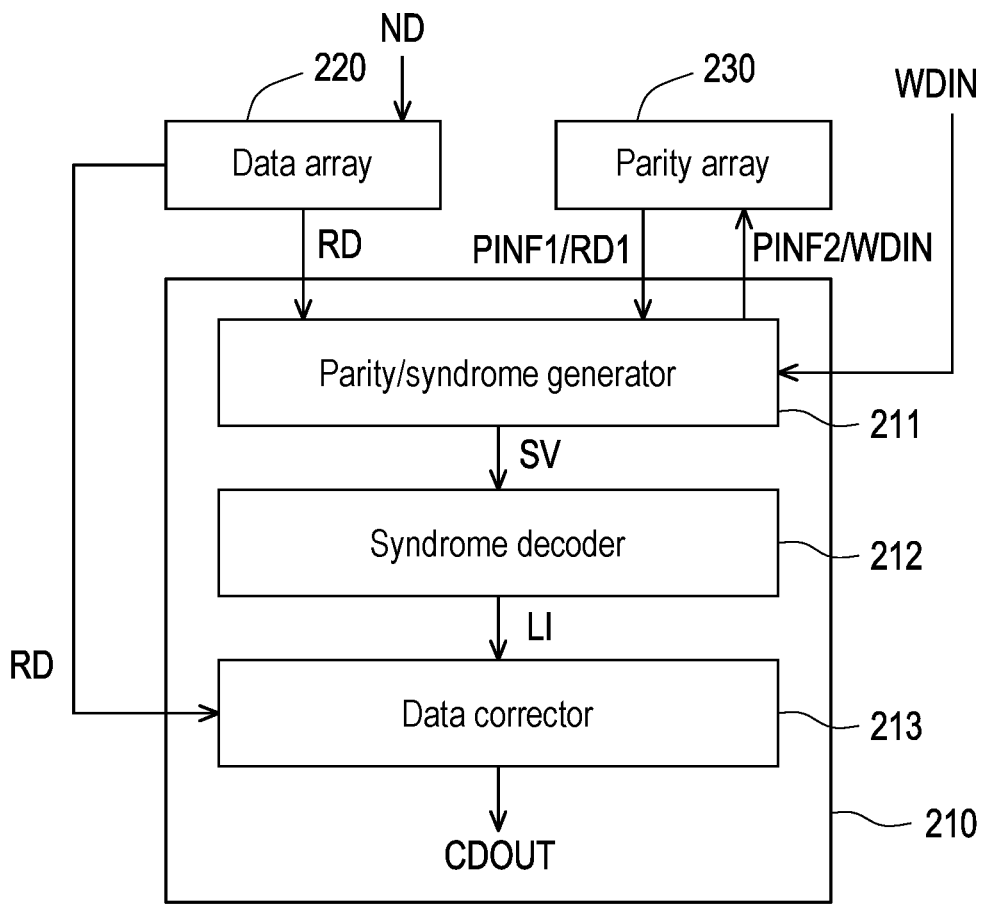
FIG. 2 illustrates a schematic diagram of a memory device according to another embodiment of present disclosure.

Please refer to FIG. 2, which illustrates a schematic diagram of a memory device according to another embodiment of present disclosure. The memory device 200 includes an error checking and correcting (ECC) circuit 210, a data array 220 and a parity array 230. In this embodiment, the ECC circuit 210 includes a parity/syndrome generator 211, a syndrome decoder 212 and a data corrector 213. The parity/syndrome generator 211 is coupled to the data array 220 and the parity array 230. The parity/syndrome generator 211 may be configured to generate parity information PINF2 according to normal data ND of the data array 120, or generate a syndrome value SV according to readout data RD and the corresponding parity information PINF1, wherein the readout data RD is read from the data array 220. The syndrome decoder 212 is coupled to the parity/syndrome generator 211, and is configured to decode the syndrome value SV generated by the parity/syndrome generator 211 to generate location information LI of at least one failure data bit of the normal data. The data corrector 213 is coupled to the syndrome decoder 212. The data corrector 213 is configured to correct the least one failure data bit of the readout data RD to generate corrected data CDOUT according to the location information LI generated by the syndrome decoder 212.

In a first test mode, the syndrome decoder 212 and the data corrector 213 are disabled, and the parity/syndrome generator 211 stops generating the parity information PINF2 and the syndrome value SV. In a second test mode, the syndrome decoder 212 and the data corrector 213 and the parity/syndrome generator 211 are enabled, and the parity/syndrome generator 211 can directly access the parity array 230 by writing write-in data WDIN or reading out the parity information PINF1 directly. Furthermore, in a third test mode, the syndrome decoder 212 and the data corrector 213 and the parity/syndrome generator 211 are enabled, and the parity/syndrome generator 211 may generated the parity information PINF2 according to the normal data ND, and respectively write the normal data ND and the parity information PINF2 into the data array 220 and the parity array 230.

In this embodiment, the parity/syndrome generator 211, syndrome decoder 212 and data corrector 213 may be implemented by digital circuits, or implemented by one or more processors with computation ability by executing programs.

Figure 3:
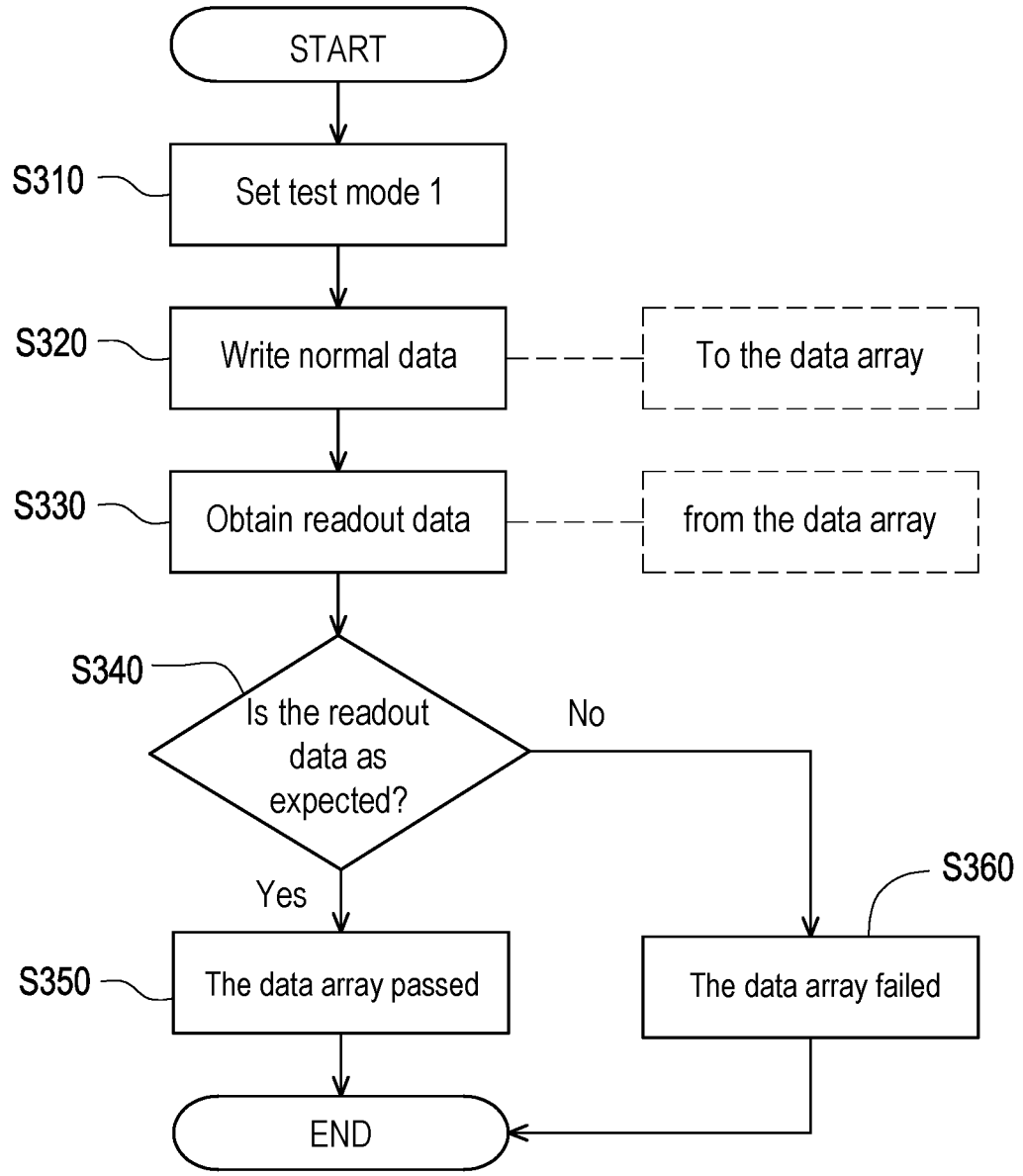
FIG. 3 illustrates a flow chart of a first test scheme of a memory device according to an embodiment of present disclosure.

Please refer to FIG. 2 and FIG. 3, wherein FIG. 3 illustrates a flow chart of a first test scheme of a memory device according to an embodiment of present disclosure. The first test scheme is configured to test the data array 220 of the memory device 200. In step S310, the ECC circuit 210 is set to the first test mode (a test mode 1) to stop the ECC function of the ECC circuit 210, and in step S320, the normal data ND is written to the data array 220. In step S330, the parity/syndrome generator 211 may read the normal data ND from the data array 220 to obtain a readout data RD, and in step S340, the parity/syndrome generator 211 may generates a test result by comparing the readout data RD with an expectation data. In detail, if the readout data RD is same as the expectation data, the test result indicating the data array is passed can be generated (step S350); and if the readout data is different from the expectation data, the test result indicating the data array is failed can be generated (step S360). In here, the expectation data may be the original normal data ND which is written into the data array 220. It should be noted here, since the step S330 is executed in the first test mode, and the ECC function of the ECC circuit 210 is disabled. That is, if there is at least one error bit in the readout data RD, and the readout data is not corrected by the ECC function. Such as that, the data array 220 can be well tested by comparing the readout data RD with the normal data ND to generate the test result.

Figure 4:
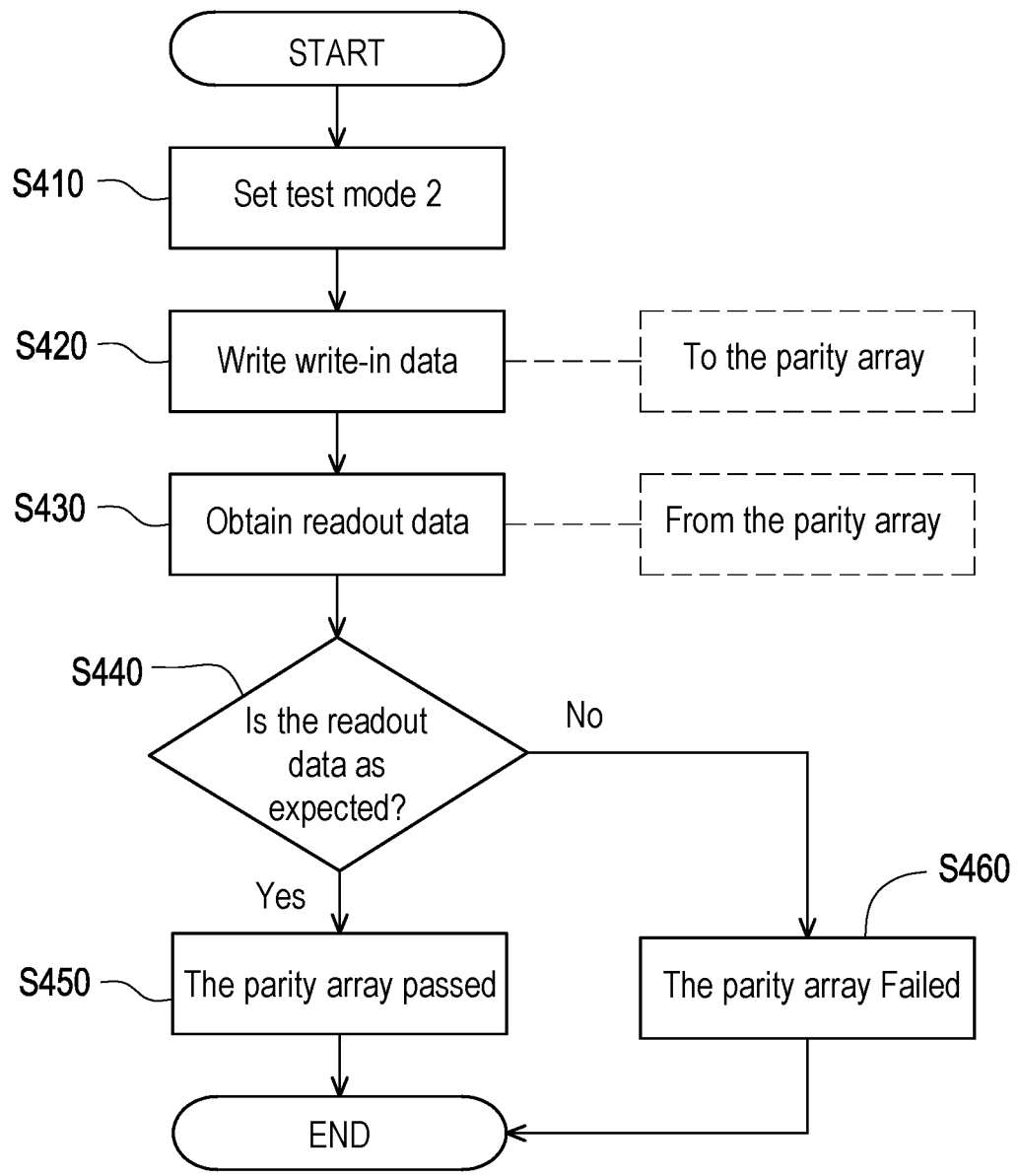
FIG. 4 illustrates a flow chart of a first test scheme of a memory device according to an embodiment of present disclosure.

Please refer to FIG. 2 and FIG. 4, wherein FIG. 4 illustrates a flow chart of a second test scheme of a memory device according to an embodiment of present disclosure. The second test scheme is configured to test the parity array 230. In step S410, the ECC circuit 210 is set to the second test mode (a test mode 2), and in this test mode, the parity array 230 can be directly accessed by the parity/syndrome generator 211. In step S420, the write-in data WDIN can be written into the parity array 230 by the parity/syndrome generator 211. Then, in step S430, the parity/syndrome generator 211 may read the write-in data WDIN in the parity array 230 to obtain readout data RD1. In step S440, the readout data RD1 can be compared with an expectation data to generate a test result. In here, the expectation data may be the write-in data WDIN. If the readout data RD1 is same as the write-in data WDIN, the test result indicating the parity array 230 is passed can be generated (step S450); and if the readout data RD1 is different from the write-in data WDIN, the test result indicating the parity array 230 is failed can be generated (step S460). Such as that, the data array 230 can be well tested by comparing the readout data RD1 with the write-in data WDIN to generate the test result.

Figure 5:
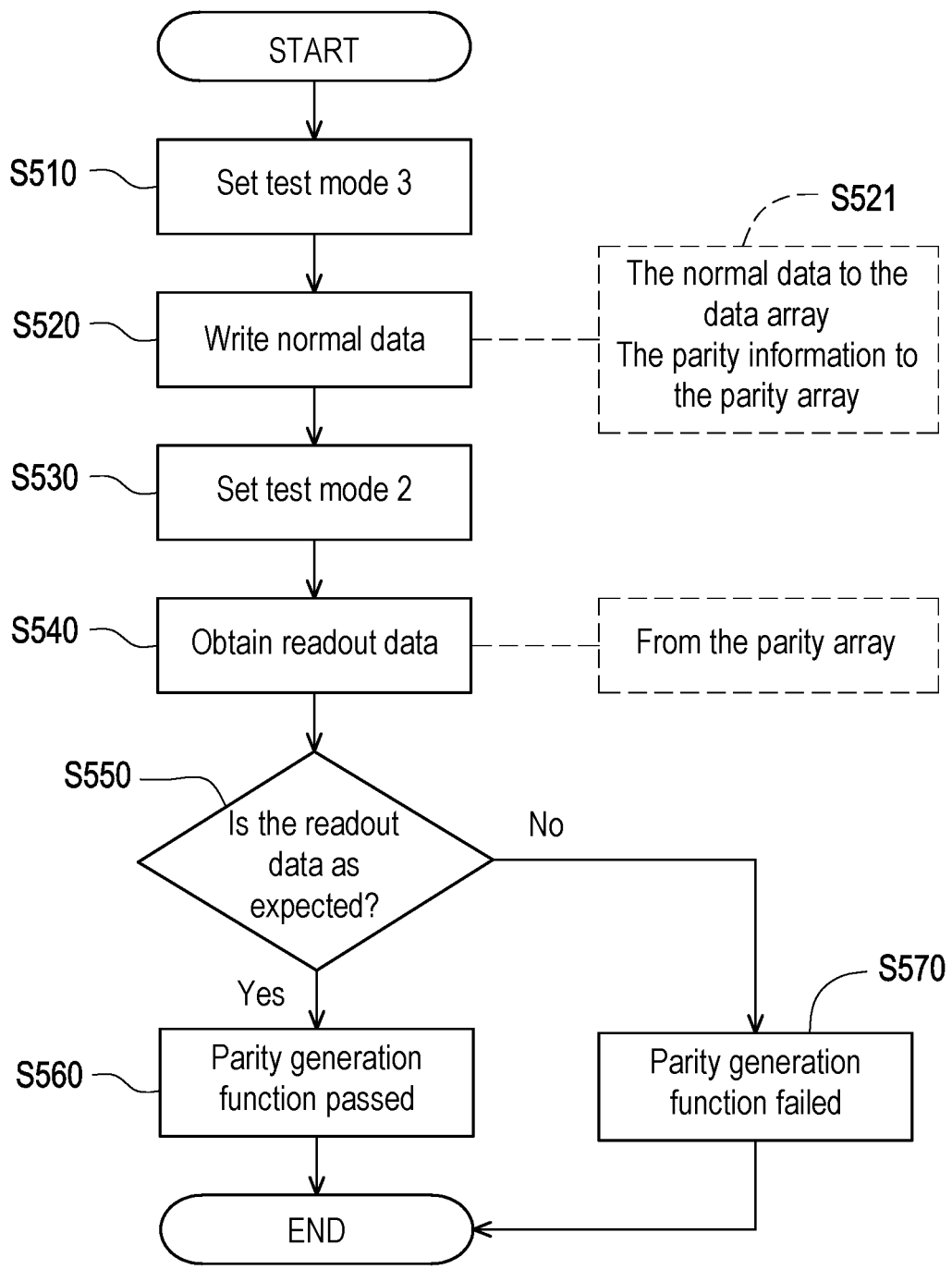
FIG. 5 illustrates a flow chart of a third test scheme of a memory device according to an embodiment of present disclosure.

Please refer to FIG. 2 and FIG. 5, wherein FIG. 5 illustrates a flow chart of a third test scheme of a memory device according to an embodiment of present disclosure. The third test scheme is configured to test the parity/syndrome generator 211 of the ECC circuit 210. In step S510, the ECC circuit 210 may be set to enter test mode 3 (the third test mode) during a first time period. In the first time period, normal data ND may be written into the data array 220, and the parity/syndrome generator 211 may generate the parity information PINF2 according to the normal data ND. Furthermore, the parity/syndrome generator 211 may write the normal data ND into the data array 220 and write the parity information PINF2 into the parity array 230 (step S521).

After the first time period, in a second time period, the ECC circuit is set to a test mode 2 (the second test mode). That is, during the second time period, the parity array 230 can be directly accessed. In step S540, the parity/syndrome generator 211 may read the parity information PINF2 from the parity array 230 to obtain a readout data RD1. Then, in step S550, the readout data RD1 may be compared with an expectation data to generate a test result. In here, the expectation data may be calculated in advanced correspond to the normal data ND and is pre-stored in the ECC circuit 210. That is, a parity generating function of the parity/syndrome generator 211 can be tested by the step 550. In this embodiment, if the readout data RD1 is same as the expectation data, the test result indicating the parity generating function passed can be generated (step S560); if the readout data RD1 is different from the expectation data, the test result indicating the parity generating function failed can be generated (step S570).

Figure 6:
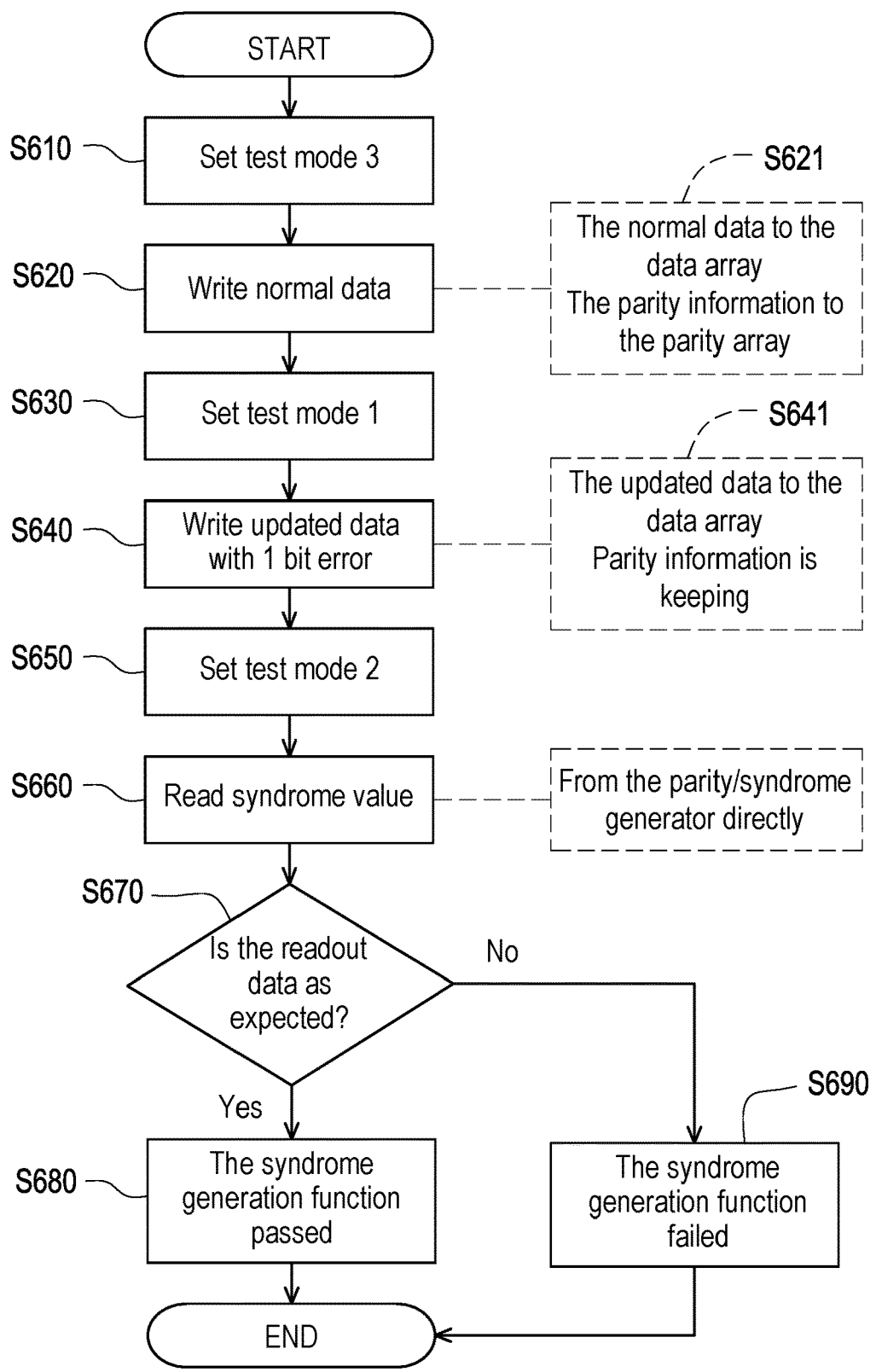
FIG. 6 illustrates a flow chart of a fourth test scheme of a memory device according to an embodiment of present disclosure.

Please refer to FIG. 2 and FIG. 6, wherein FIG. 6 illustrates a flow chart of a fourth test scheme of a memory device according to an embodiment of present disclosure. The third test scheme is configured to test the parity/syndrome generator 211 of the ECC circuit 210. In step S610, the ECC circuit 210 may be set to a test mode 3 (the third test mode) during a first time period. In step 620, during the first time period, normal data ND may be written into the data array 220, and the parity/syndrome generator 211 may generate the parity information PINF2 according to the normal data ND. Furthermore, the parity/syndrome generator 211 may write the normal data ND into the data array 220 and write the parity information PINF2 into the parity array 230 (step S621). In step S630, the ECC circuit 210 may be set to a test mode 1 (the first test mode) to disable the ECC function of the ECC circuit 210 during a second time period.

During the second time period, in step S640, an updated data with 1 bit error with the normal data ND can be generated. Then the updated data is written to the data array 220 by the parity/syndrome generator 211, and the corresponding parity information is kept unchanged (in step S641).

After the second time period, during a third time period, the ECC circuit 210 is set to enter test mode 2 (the second test mode). In step S660, a syndrome value generated by the parity/syndrome generator 211 can be read directly to obtain readout data. In step S670, a test result can be generated by comparing the readout data with an expectation data. In this case, since there is one bit error in the updated data, a correct syndrome value generated by the parity/syndrome generator 211 is not zero. In this embodiment, the expectation data may be the correct syndrome value, if the readout data is same as the expectation data, the test result indicating the syndrome generation function of the parity/syndrome generator 211 passed can be generated (in step S680); and if the readout data is different from the expectation data, the test result indicating the syndrome generation function of the parity/syndrome generator 211 failed can be generated (in step S690).

Figure 7:
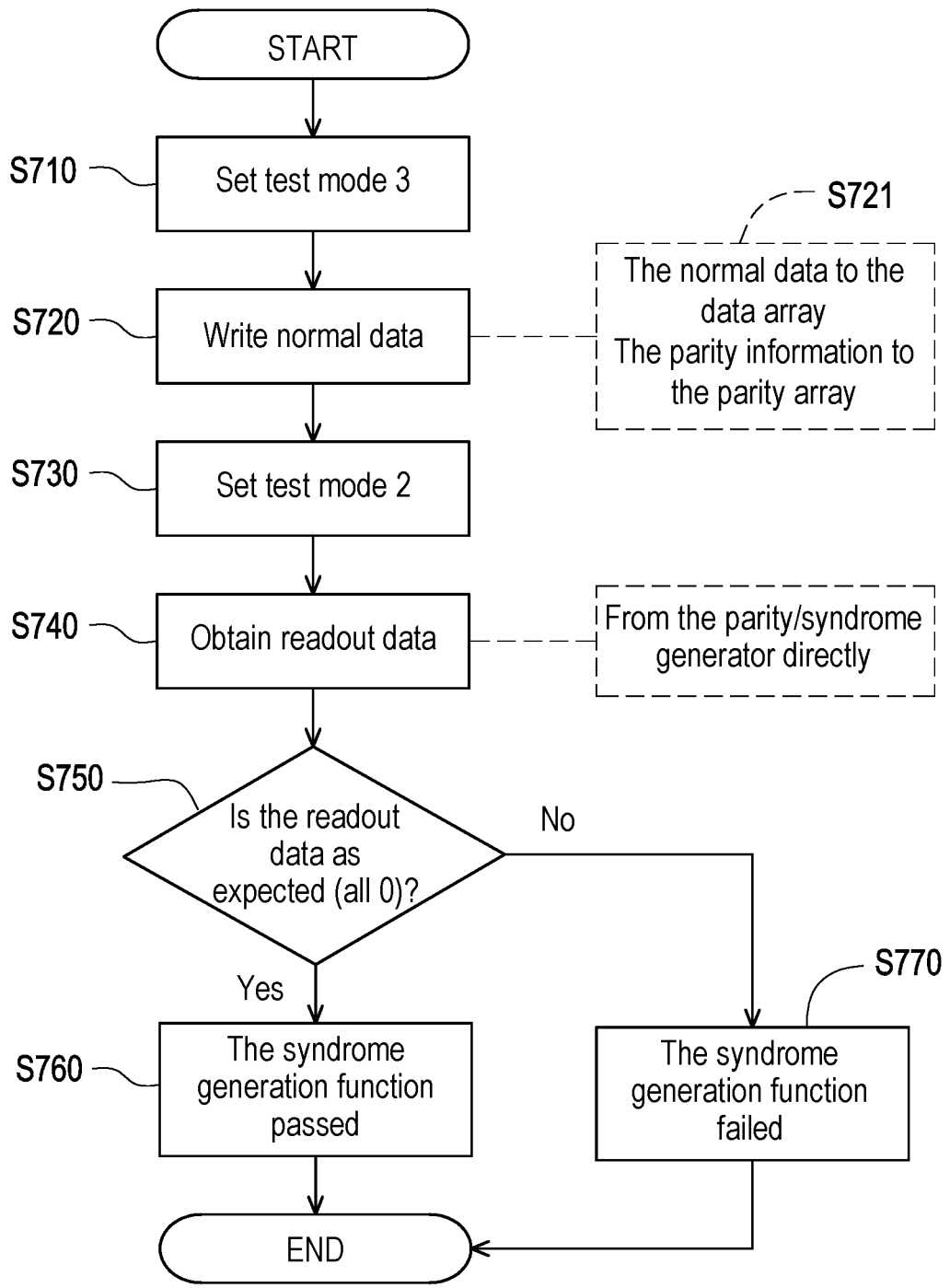
FIG. 7 illustrates a flow chart of a fifth test scheme of a memory device according to an embodiment of present disclosure.

Please refer to FIG. 2 and FIG. 7, wherein FIG. 7 illustrates a flow chart of a fifth test scheme of a memory device according to an embodiment of present disclosure. The fifth test scheme is configured to test the parity/syndrome generator 211 of the ECC circuit 210. In step S710, the ECC circuit 710 is set to enter test mode 3 (the third test mode) during a first time period. In step S720, normal data ND is written into the data array 220 and the parity/syndrome generator 211 may generate parity information PINF2 according to the normal data ND. The parity/syndrome generator 211 further writes the normal data ND to the data array 220, and writes the parity information PINF2 into parity array 230 (in step S721).

In step S730, the ECC circuit is set to enter test mode 2 (the second test mode) during a second time period after the first time period. In step S740, a syndrome value generated by the parity/syndrome generator 211 may be directly read and readout data can be obtained. In step S750, the readout data can be compared with expectation data (in step S750) to generated a test result. In here, the expectation data may be all 0, if the syndrome value is same as the expectation data, the test result indicating the syndrome generation function of the parity/syndrome generator 211 passed may be generated; and if the syndrome value is different from the expectation data, the test result indicating the syndrome generation function of the parity/syndrome generator 211 failed may be generated.

Figure 8:
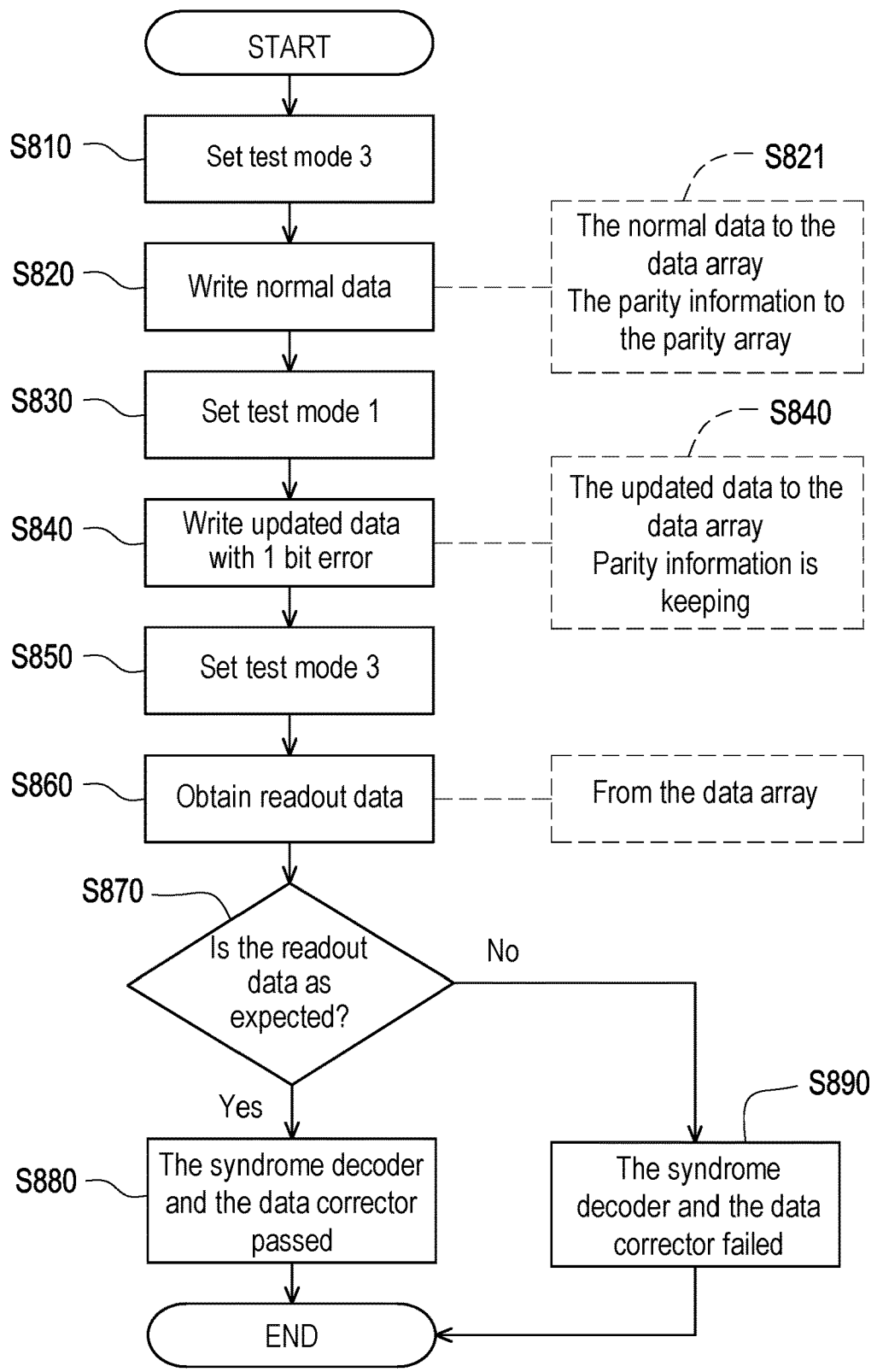
FIG. 8 illustrates a flow chart of a sixth test scheme of a memory device according to an embodiment of present disclosure.

Please refer to FIG. 2 and FIG. 8, wherein FIG. 8 illustrates a flow chart of a sixth test scheme of a memory device according to an embodiment of present disclosure. The sixth test scheme is configured to test the syndrome decoder 212 and the data corrector 213 of the ECC circuit 210. In step S810, the ECC circuit 210 is set to enter test mode 3 (the third test mode) during a first time period. In step S820, normal data ND is written into the data array 220, and the parity information PINF2 corresponding to the normal data ND can be generated. The normal data ND is written into the data array 220 and the parity information PINF2 is written into the parity array 230.

In step S830, the ECC circuit is set to enter test mode 1 (the first test mode) during a second time period after the first time period. In step S840, updated data with one bit error may be written into the data array 220, and the corresponding parity information is kept unchanged (in step S841).

In step S850, the ECC circuit 210 is further set to enter the test mode 3 (the third test mode) again during a third time period after the second time period. In step S860, the parity/syndrome generator 211 may read the data array 220 to obtain readout data RD, and generates a test result by checking the readout data RD is same as expectation data or not (in step S870). In this embodiment, since the syndrome decoder 212 and the data corrector 213 are enabled during the third time period, the error bit in the updated data can be correct by the syndrome decoder 212 and the data corrector 213 if functions of the syndrome decoder 212 and the data corrector 213 are passed. In step S880, if the readout data RD is same as the expectation data, the test result indicating the syndrome decoder 212 and the data corrector 213 passed can be generated. In step S890, if the readout data RD is different from the expectation data, the test result indicating the syndrome decoder 212 and the data corrector 213 failed can be generated. In this embodiment, the expectation data is same as the normal data ND.

It should be noted here, from the embodiments mentioned above, components of the ECC circuit 210, data array 220 and parity array 230 can be individually tested by used the test schemes mentioned above. Functions of the memory device 200 can be confirmed by using the test schemes of present embodiments.

Furthermore, the test mode of the ECC circuit 210 may be controlled by a control signal with 2 bits. In detail, for example, if the control signal is 01 in binary, the ECC circuit 210 may enter the first test mode; if the control signal is 10 in binary, the ECC circuit 210 may enter the second test mode; and if the control signal is 00 in binary, the ECC circuit 210 may enter the third test mode.

Figure 9:
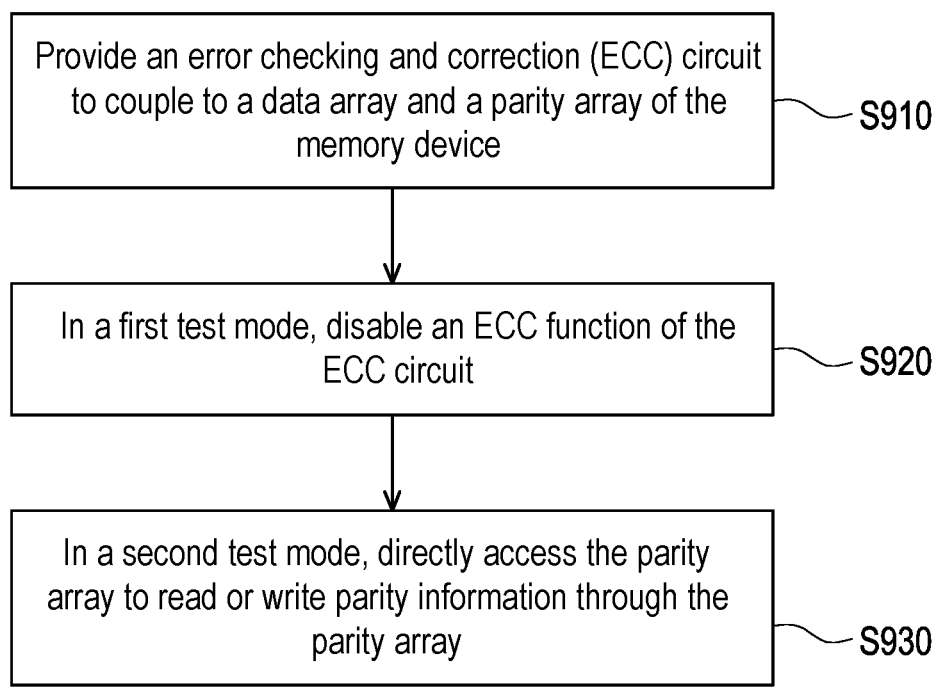
FIG. 9 illustrates a flow chart of a test method of a memory device according to an embodiment of present disclosure.

Please refer to FIG. 9, which illustrates a flow chart of a test method of a memory device according to an embodiment of present disclosure. In step S910, an error checking and correction (ECC) circuit is provided to be coupled to a data array and a parity array of the memory device. In step S920, in a first test mode, an ECC function of the ECC circuit may be disabled. In step S930, in a second test mode, the parity array of the memory device may be directly accessed to read or write parity information through the parity array.

Detail operation of the steps S910 to S930 have been described in the embodiment mentioned above, and no more repeated descriptions here.

In summary, the test method of present disclosure provides the first test mode to disable the ECC function of the memory device. Such as that, the data array can be tested through the first test mode. The test method of present disclosure provides the second test mode to provide a path to directly access the parity array of the memory device. Such as that, the parity array of the memory device can be tested through the second test mode. The test method further mixes the third test mode with at least one of the first test mode and the second test mode. Such as that, function of the ECC circuit of the memory device can be further tested to make sure the ECC function can be performed properly.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device, comprising:
   a data array and a parity array;
   an error checking and correction (ECC) circuit, coupled to the data array and the parity array,
   wherein in a first test mode, an ECC function of the ECC circuit is disabled, and in a second test mode, the ECC circuit directly accesses the parity array to read or write parity information through the parity array,
   wherein in a third test mode, the ECC circuit generates the parity information by a parity/syndrome generator according to normal data written to the data array and writes the parity information into the parity array.

2. The memory device according to claim 1, wherein the ECC circuit comprises:
   the parity/syndrome generator, coupled to the data array and the parity array, generating a parity information according to normal data or generating a syndrome value according to readout data and corresponding parity information;
   a syndrome decoder, coupled to the parity/syndrome generator, decoding the syndrome value to generate location information of at least one failure data bit;
   a data corrector, coupled to the syndrome decoder, correcting the least one failure data bit of the readout data according to the location information.

3. The memory device according to claim 2, wherein in a test scheme for testing the data array, the ECC circuit enters the first test mode, the parity/syndrome generator reads out a normal data in the data array to obtain a readout data, and generates a test result by comparing the readout data with an expectation data.

4. The memory device according to claim 2, wherein in a test scheme for testing the parity array, the ECC circuit enters the second test mode, the parity/syndrome generator writes write-in data to the parity array, and then reads the write-in data in the parity array to obtain a readout data, the parity/syndrome generator further generates a test result by comparing the readout data with an expectation data.

5. The memory device according to claim 1, wherein in a test scheme for testing the parity/syndrome generator, the ECC circuit is configured to:
   enter the third test mode during a first time period, and generate the parity information according to the normal data and write the parity information into the parity array by the parity/syndrome generator; and
   enter the second test mode during a second time period after the second time period, read the parity information in the parity array to obtain a readout data, and generate a test result by comparing the readout data with an expectation data.

6. The memory device according to claim 1, wherein in a test scheme for testing the parity/syndrome generator, the ECC circuit is configured to:
   enter the third test mode during a first time period, and generate the parity information according to the normal data and write the parity information into the parity array by the parity/syndrome generator;
   enter the first test mode during a second time period after the second time period, update the normal data with 1 bit error to obtain updated data, write the updated data to the data array and keep the parity information unchanged by the parity/syndrome generator; and
   enter the second test mode, generate the syndrome value by the parity/syndrome generator and generate a test result by checking the syndrome value.

7. The memory device according to claim 1, wherein in a test scheme for testing the parity/syndrome generator, the ECC circuit is configured to:
   enter the third test mode during a first time period, and generate the parity information according to the normal data and writing the parity information into the parity array by the parity/syndrome generator; and
   enter the second test mode during a second time period after the first time period, generate the syndrome value by the parity/syndrome generator and generate a test result by checking the syndrome value.

8. The memory device according to claim 1, wherein in a test scheme for testing the syndrome decoder and the data corrector, the ECC circuit is configured to:
   enter the third test mode during a first time period, and generate the parity information according to the normal data and write the parity information into the parity array by the parity/syndrome generator;
   enter the first test mode during a second time period after the first time period, update the normal data with 1 bit error to obtain updated data, write the updated data to the data array and keep the parity information unchanged by the parity/syndrome generator; and
   re-enter the third test mode during a third time period after the second time period, read the updated data in the data array to obtain readout data, and generate a test result by comparing the readout data with an expectation data.

9. The memory device according to claim 1, wherein the ECC circuit is controlled by a test mode controller signal to enter the first test mode or the second test mode.

10. A test method of a memory device, comprising:
    providing an error checking and correction (ECC) circuit to couple to a data array and a parity array of the memory device;
    in a first test mode, disabling an ECC function of the ECC circuit;
    in a second test mode, directly accessing the parity array to read or write parity information through the parity array; and
    in a third test mode, generating the parity information according to normal data written to the data array and writes the parity information into the parity array by a parity/syndrome generator.

11. The test method according to claim 10, wherein in a test scheme for testing the data array, comprising:
    entering the first test mode, reads out a normal data in the data array to obtain a readout data by the parity/syndrome generator of the ECC circuit; and
    generating a test result by comparing the readout data with an expectation data.

12. The test method according to claim 10, wherein in a test scheme for testing the parity array, comprising:
    entering the second test mode, and writing write-in data to the parity array by the parity/syndrome generator;
    then reading the write-in data in the parity array to obtain a readout data; and
    generating a test result by comparing the readout data with an expectation data.

13. The test method according to claim 10, wherein in a test scheme for testing the parity/syndrome generator of the ECC circuit, comprising:
   entering the third test mode during a first time period, and generating the parity information according to the normal data and write the parity information into the parity array by the parity/syndrome generator; and
   entering the second test mode during a second time period after the second time period, reading the parity information in the parity array to obtain a readout data, and generating a test result by comparing the readout data with an expectation data.

14. The test method according to claim 10, wherein in a test scheme for testing the parity/syndrome generator of the ECC circuit, comprising:
   entering the third test mode during a first time period, and generating the parity information according to the normal data and writing the parity information into the parity array by the parity/syndrome generator;
   entering the first test mode during a second time period after the second time period, updating the normal data with 1 bit error to obtain updated data; writing the updated data to the data array and keeping the parity information unchanged by the parity/syndrome generator; and
   entering the second test mode, generating the syndrome value by the parity/syndrome generator and generating a test result by checking the syndrome value.

15. The test method according to claim 10, wherein in a test scheme for testing the parity/syndrome generator of the ECC circuit, comprising:
   entering the third test mode during a first time period, and generating the parity information according to the normal data and write the parity information into the parity array by the parity/syndrome generator; and
   entering the second test mode during a second time period after the first time period, generating the syndrome value by the parity/syndrome generator and generating a test result by checking the syndrome value.

16. The test method according to claim 10, wherein in a test scheme for testing a syndrome decoder and a data corrector of an ECC circuit, comprising:
   entering the third test mode during a first time period, and generating the parity information according to the normal data and write the parity information into the parity array by the parity/syndrome generator;
   entering the first test mode during a second time period after the first time period, updating the normal data with 1 bit error to obtain updated data, writing the updated data to the data array and keeping the parity information unchanged by the parity/syndrome generator; and
   re-entering the third test mode during a third time period after the second time period, reading the updated data in the data array to obtain readout data, and generating a test result by comparing the readout data with an expectation data.

* * * * *